United States Patent
Funato

(10) Patent No.: US 7,511,485 B2
(45) Date of Patent: Mar. 31, 2009

(54) MAGNETIC FIELD MEASUREMENT METHOD AND SYSTEM

(75) Inventor: Hiroki Funato, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 387 days.

(21) Appl. No.: 11/342,693

(22) Filed: Jan. 31, 2006

(65) Prior Publication Data

US 2007/0176599 A1 Aug. 2, 2007

(51) Int. Cl.
*G01R 33/02* (2006.01)
*G01R 33/025* (2006.01)
*G01R 31/315* (2006.01)

(52) U.S. Cl. .................. 324/260; 324/750
(58) Field of Classification Search .......... 324/117 R, 324/117 H, 260, 261, 262, 263, 750; 702/64, 702/65
See application file for complete search history.

(56) References Cited

U.S. PATENT DOCUMENTS 6,625,554 B2 * 9/2003 Suga et al. ............... 702/64

2002/0039030 A1 * 4/2002 Khazei ...................... 324/750

FOREIGN PATENT DOCUMENTS

| JP | 03-199986 | 8/1991 |
| JP | 04-164274 | 6/1992 |
| JP | 2002-156430 | 5/2002 |
| JP | 2003-279611 | 10/2003 |

* cited by examiner

*Primary Examiner*—Kenneth J Whittington
(74) *Attorney, Agent, or Firm*—Antonelli, Terry, Stout & Kraus, LLP.

(57) ABSTRACT

To measure a magnetic field strength at each scan spacing s which is smaller than a loop size by scanning a magnetic field sensor (loop antenna) of the loop size. A magnetic field strength distribution is determined with spatial resolution of the spacing s along a scan direction, by performing arithmetic processing including addition and subtraction in relation to each of the measured magnetic field strength values. It is to be noted that the magnetic field sensor may be a magnetic field sensor array with plural magnetic field sensors placed at the spacing s.

11 Claims, 11 Drawing Sheets

F I G . 1
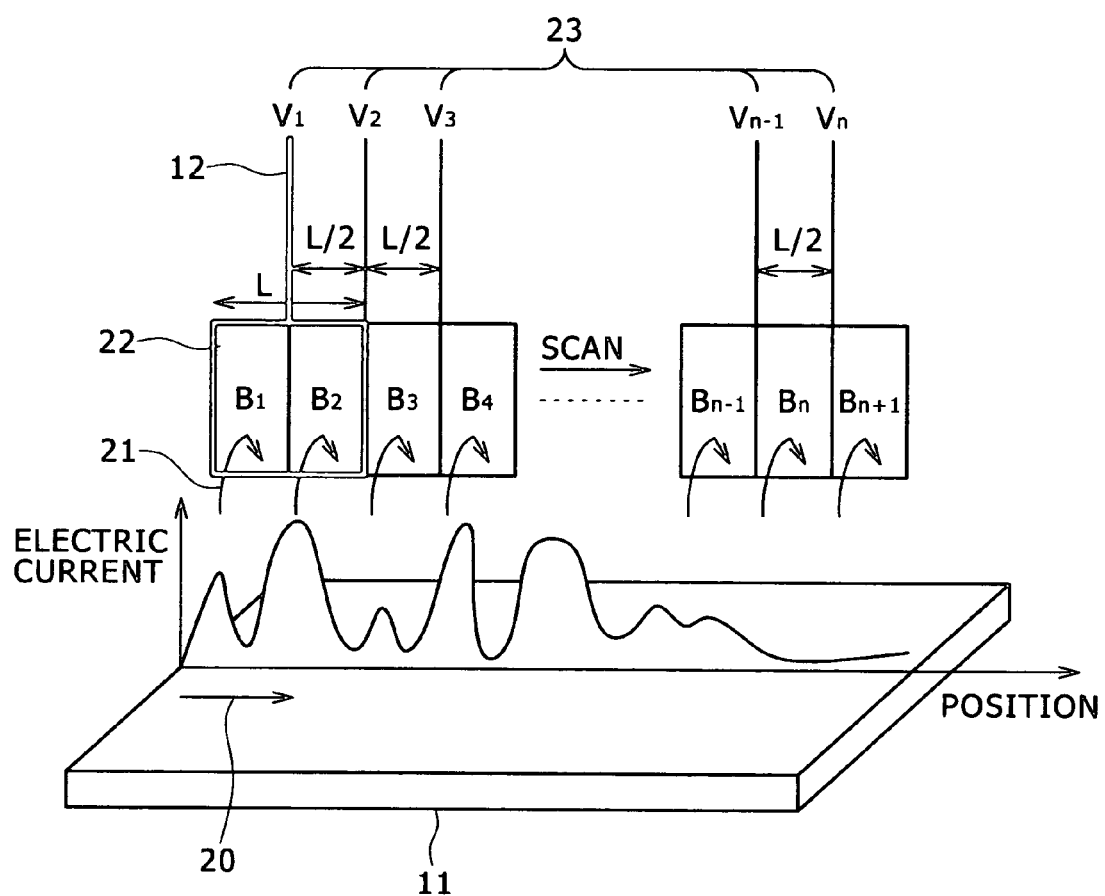

TYPE 1　　　　　　　　　　TYPE 2

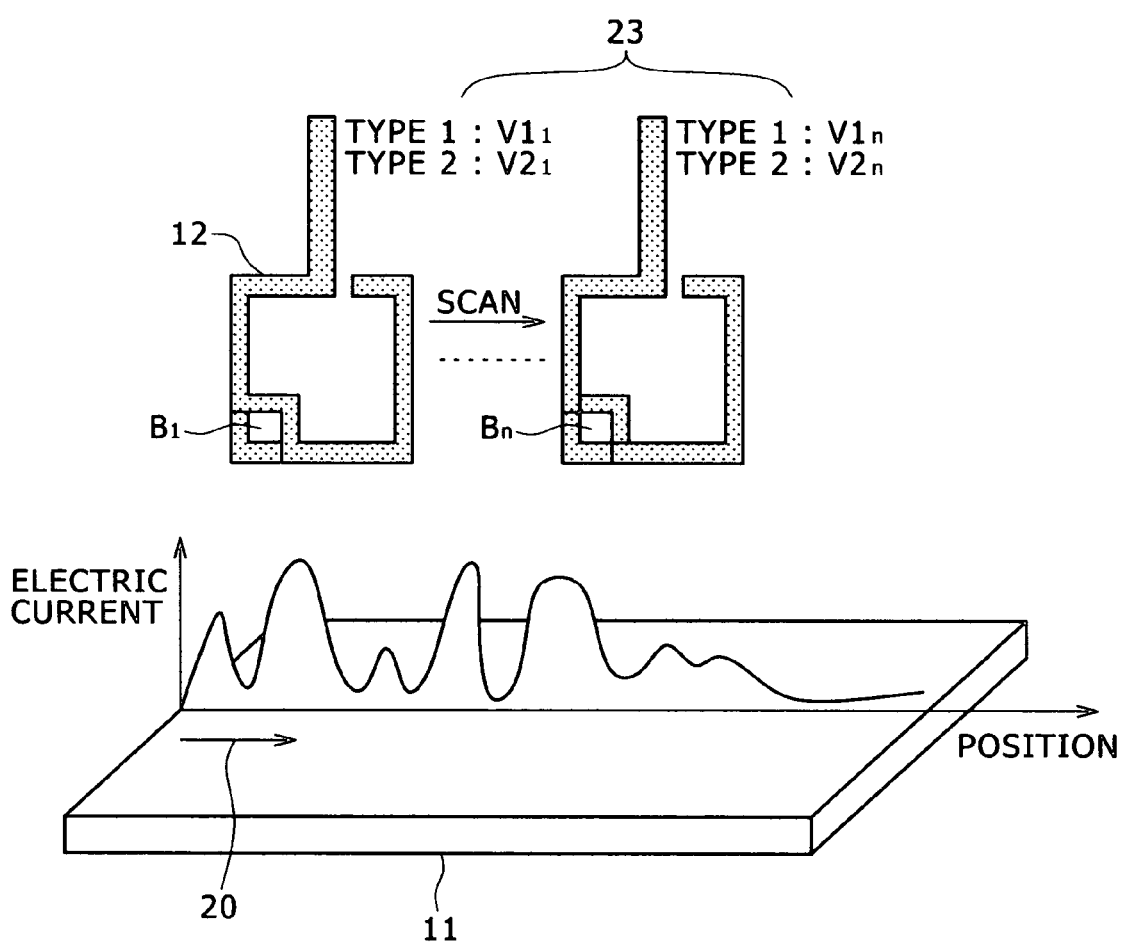

MAGNETIC FIELD MEASUREMENT METHOD AND SYSTEM

BACKGROUND OF THE PRESENT INVENTION

The present invention relates to a magnetic field measurement method and magnetic field measurement system for measuring the strength of a magnetic field generated inside or outside electronic equipment with high resolution.

In the electronic equipment and other devices, in order to identify the position of the electric current causing the electromagnetic spectrum, or the portion thereof causing malfunctions and other operational difficulties due to electromagnetic mutual interference, there is a need to measure the magnetic field distribution in the vicinity of the electronic equipment two-dimensionally or three-dimensionally. Heretofore, the present applicant has been proposed a magnetic field probe and an electromagnetic wave generation detecting device as described in Patent Reference 1 (JP-A-2002-156430), Patent Reference 2 (JP-A-2003-279611). Of these, the former relates to a configuration of a magnetic field detection coil (loop antenna), and the latter relates to an apparatus for measuring the magnetic field distribution three-dimensionally to detect the electromagnetic wave generating source.

Generally, the magnetic field in the vicinity of the electronic equipment is measured using a loop antenna from the induced voltage at the time when the loop antenna is placed in the vicinity of the electronic equipment, thus the magnetic field strength at this position can be determined. The spatial distribution of the magnetic field strength is measured by scanning the position of the loop antenna in the vicinity of the electric equipment, thus the spatial distribution thereof can be determined. The spatial resolution of the magnetic field strength measured at this time is decided in accordance with the size of the loop antenna. Further, the identification accuracy of the portion which is the magnetic field generating source depends on the distance between the loop antenna and the electric equipment (generating source).

SUMMARY OF THE PRESENT INVENTION

To measure with high accuracy the magnetic field strength generated from the measurement object (electronic equipment) with spatially high resolution and to identify the portion which is the generating source thereof, the magnetic field sensor (loop antenna) used for the measurement should be made substantially compact to allow the sensor to approximate the measurement object. Thus, there is a need to manufacture the loop antenna of the size corresponding to the required resolution depending on the measurement object. For example, a loop antenna of a size of several μm is required in order to identify the magnetic field that the electric current flowing to the LSI wiring pattern generates, for each wiring.

Generally, the loop antenna is manufactured using a semiconductor process on a PCB (Printed Circuit Board). However, manufacturing the above-described very compact loop antenna of a size of several μm is not easy. In addition, a new connection implementing technology in which signals are not degraded in the high-frequency region is required for sending signals to the measuring system from such a very compact antenna.

The present invention is to provide a magnetic field measurement method and magnetic field measurement system for measuring the magnetic field with spatial resolution smaller than the size of the magnetic field sensor, without making the size of the magnetic field sensor substantially compact.

The present invention is a magnetic field measurement method using a magnetic field sensor of a detection width L, the method including the steps of: scanning the magnetic field sensor in a direction of the detection width; measuring a magnetic field strength for each spacing s which is smaller than the detection width L; and performing arithmetic processing including addition and subtraction in relation to the magnetic field strength values measured for each spacing s, thereby to determine the magnetic field strength at the detection width of the spacing s along a scanning direction.

Further, the present invention is a magnetic field measurement method using a magnetic field sensor of a detection width L, the method including the steps of: placing plural magnetic field sensors at a spacing s which is smaller than the detection width L in a direction of the detection width; measuring a magnetic field strength for each of the magnetic field sensors; and performing arithmetic processing including addition and subtraction in relation to the magnetic field strength values measured for each of the magnetic field sensors, thereby to determine the magnetic field strength at the detection width of the spacing s along a placement direction.

Further, the present invention is a magnetic field measurement method using a first magnetic field sensor and second magnetic field sensor in which a portion of a detection area shape differs between them, the method including the steps of: measuring a magnetic field strength at a desired position by the first magnetic field sensor; measuring the magnetic field strength at the same position by the second magnetic field sensor; and calculating a difference of the measured magnetic field strength values, thereby to determine the magnetic field strength in an area of the portion in which the detection area shape is different between the first and second magnetic field sensors.

Further, the present invention is a magnetic field measurement system using a magnetic field sensor of detection width L, the system including: a control section for scanning the magnetic field sensor at spacing s which is smaller than the detection width L in a detection width direction; a measurement section for measuring a magnetic field strength at the spacing s from a detection signal of the magnetic field sensor; and an arithmetic operation section for performing arithmetic processing including addition and subtraction in relation to the magnetic field strength values measured by the measurement section at each spacing s, thereby to determine the magnetic field strength at the detection width of the spacing s along a scanning direction.

Further, the present invention is a magnetic field measurement system using a magnetic field sensor of a detection width L, the system including: a magnetic field sensor array with plural magnetic field sensors placed at spacing s which is smaller than the detection width L in a direction of the detection width; a measurement section for measuring a magnetic field strength at each spacing s from the magnetic field sensor array; and an arithmetic operation section for performing arithmetic processing including addition and subtraction in relation to the magnetic field strength measured by the measurement section at each spacing s, thereby to determine the magnetic field strength at the detection width of the spacing s along a placement direction.

Herein, as the magnetic field sensor, it is preferable to use a loop antenna having a rectangular shape.

Further, the spacing s is made variable to allow the spacing s to be set according to the desired resolution.

BRIEF DESCRIPTION OF THE DRAWINGS

FIG. 1 is a schematic diagram showing an embodiment of a magnetic field measurement method according to the present invention;

FIG. 11 is a schematic diagram showing an embodiment of a magnetic field measurement method using the magnetic field sensors of FIG. 10.

DESCRIPTION OF THE PREFERRED EMBODIMENTS

Figure 2:
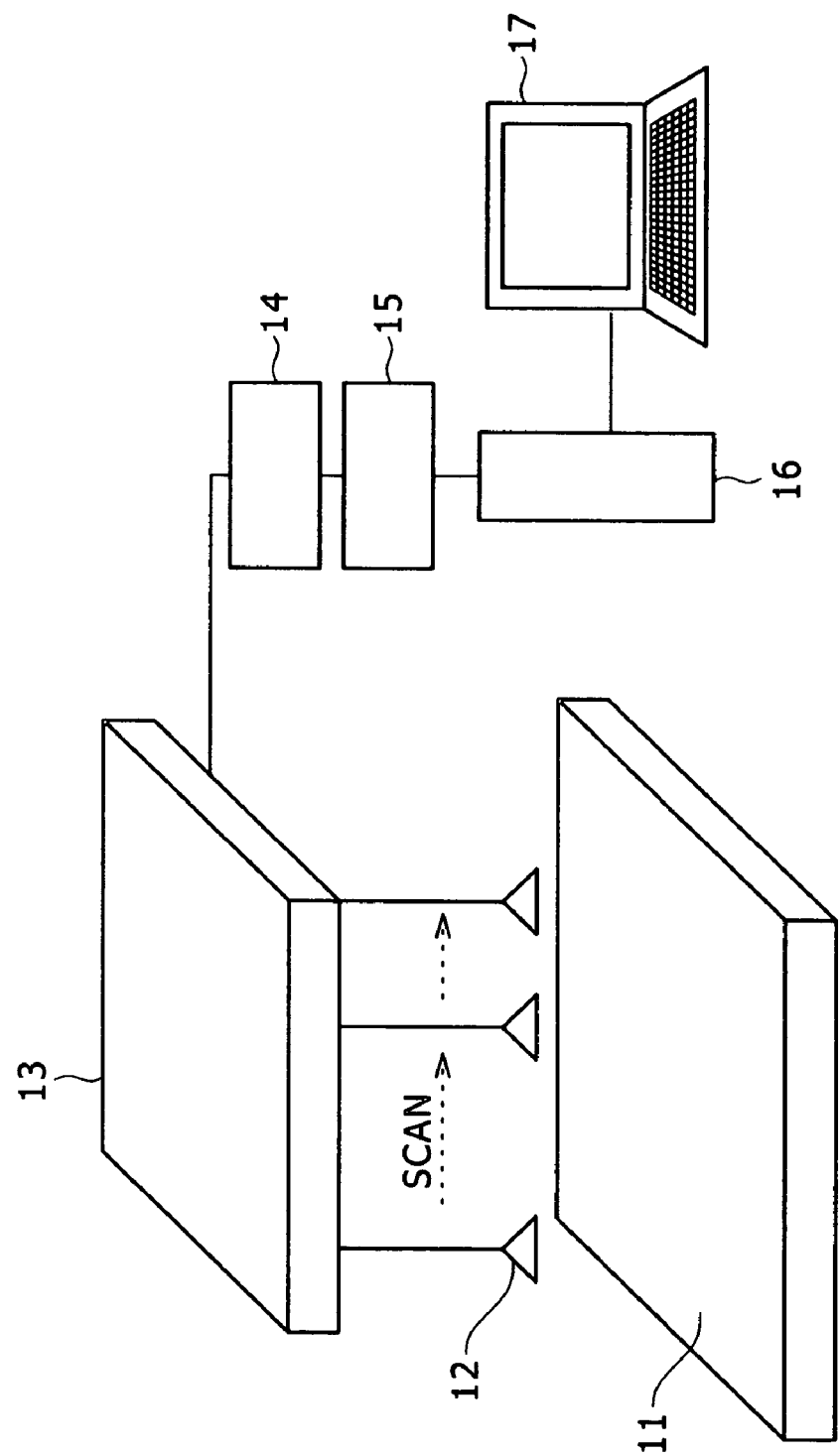
FIG. 2 is a block diagram showing an embodiment of a magnetic field measurement system according to the present invention.

Hereinafter, the embodiments of the present invention will be described with reference to the drawings.

Embodiment 1

FIG. 1 is a schematic diagram showing an embedment of a magnetic field measurement method according to the present invention. Reference numeral 11 denotes a measurement object such as an enclosure of electronic equipment or an LSI electronic component, and an electric current 20 flowing through inside (or the surface) of the measurement object is to be a magnetic field generating source. A magnetic field sensor 12 is illustrated, as an example, in the case of a loop antenna made of a rectangular loop coil, where the loop size (detection width) is denoted as L. To make the description simple, the loop coil is assumed to have one turn. However, it is possible to make the coil have several turns to improve the sensitivity. A magnetic flux 22 proportional to the magnetic field strength is interlinked with the loop coil of the magnetic field sensor 12 due to a magnetic field 21 generated from the measurement object 11. The magnetic field sensor 12 detects an induced voltage 23 proportional to the time change of the interlinkage magnetic flux. Then, magnetic flux density B interlinked with the loop coil, namely the magnetic field within the loop width L can be determined from detected voltage V.

In the embodiment, the magnetic field sensor (loop antenna) 12 is scanned along the direction of its loop width (from the left to right direction in the figure). Then, the induced voltage V is measured for each scan spacing which is half of the loop width L, namely L/2. Upon completion of the measurement over the desired range of the measurement object 11, the arithmetic operation is performed using each of the measured voltage values V. The arithmetic equations will be described below. As a result of the arithmetic operation, the magnetic flux density B (or magnetic field) for each scan spacing L/2 can be determined. In other words, the embodiment makes it possible to measure the magnetic field distribution with the spatial resolution of detection the width L/2, using the loop antenna of detection width L.

Next, the arithmetic equations will be described. The loop width of the loop antenna 12 is represented by L, the scan spacing by L/2, the magnetic flux densities for each scan spacing L/2 by B1, B2 and so on, respectively. With the loop area So, the displacement area for each scan is defined as S=So/2. The induced voltages of the loop antenna at each measuring position, when represented by V1, V2 and so on, are defined by V1=ωS(B1+B2), V2=ωS(B2+B3) and so on, depending on the magnetic flux density B interlinked within the loop. Here ω is the angle frequency. Then, as shown in Equation (1), the processing of addition and subtraction is performed for the measured voltage values V1, V2 and so on, respectively.

First, the difference between the voltages V1 and V2 is calculated to leave the B1 component, while deleting the B2 component. At this time, the B3 component remains, but is deleted by adding V3. The further remaining B4 component is deleted by subtracting V4. Subsequently, this is repeated and finally the B1 component and the Bn+1 component remain.

$$V1 = (B1 + B2) \times \omega S -)$$
$$V2 = (B2 + B3) \times \omega S +)$$
$$V3 = (B3 + B4) \times \omega S +)$$
$$...$$
$$Vn-1 = (Bn-1 + Bn) \times \omega S -)$$
$$Vn = (Bn + Bn+1) \times \omega S$$
$$V1 - V2 + V3 ... + (Vn-1) - (Vn) = (B1 - Bn+1) \times \omega S \quad (1)$$

Here, for the last component Bn+1, approximating the magnetic flux density within the loop as uniform (Bn≈Bn+1) and setting Bn+1=Vn/2ωS, it is:

$$V1-V2+V3 ... +(Vn-1)-(Vn)=B1\omega S-Vn/2$$

Setting S=So/2, the magnetic flux density B1 at the measurement starting point can be determined by the following equation:

$$B1=(2/\omega So)\{V1-V2+V3 ... +(Vn-1)-(Vn/2)\} \quad (2)$$

Similarly, by displacing the operation starting positions as V2, V3, the magnetic field densities at the other positions can be expressed as:

$$B2=(2/\omega So)\{V2-V3+V4 ... -(Vn-1)+(Vn/2)\} \quad (3)$$

$$B3=(2/\omega So)\{V3-V4+V5 ... -(Vn-1)-(Vn/2)\} \quad (4)$$

Although an error actually occurs caused by the approximation, the error can be sufficiently suppressed by taking the scan distance of the loop antenna 12 long enough compared to the measurement object 11 and performing the approximation of the equations (2) to (4) at positions in which a strong electric current does not exist in the vicinity thereof.

With such an arithmetic method, by using the loop antenna of the scan direction dimension (detection width) L and measuring at the scan acing L/2, the measurement result with resolution equivalent to the loop antenna of the scan direction dimension L/2 can be obtained.

FIG. 2 is a block diagram showing an embodiment of a magnetic field measurement system according to the present invention. The measurement method is based on the method described above in FIG. 1. The magnetic field (magnetic flux) generated from the measurement object 11 is detected by the magnetic field sensor 12 such as the loop antenna. A controller 13 mechanically scans the magnetic field sensor 12 of detection width L at L/2 spacing to control the measurement position. A filter or amplifier 14 extracts a desired frequency component from the detection signal of the magnetic field sensor 12, and amplifies it to a desired signal level. The filter may not be a band pass filter, but may be a combination of a variable high-pass filter and a variable low-pass filter, in which the measurement frequency can be arbitrary set. A measurement unit 15 takes in a signal from the filter or amplifier 14 to acquire the induced voltage (magnetic field strength) at each position. A computer 16 performs the arithmetic processing described in the above equations (1) to (4) based on the measured data from the measurement unit 15, thereby to determine the magnetic field strength at each position with the resolution of the scan spacing L/2. The computer 16 includes a program and CPU for carrying out the arithmetic operation, and a memory for storing the operation results. A display unit 17 graphically displays the magnetic field distribution based on the operation results of the computer 16.

Here, it is preferable that the magnetic field sensor 12 is placed so as to satisfy the following: distance from the measurement object 11 $r \leq \lambda/2\pi$ (where $\lambda$ is the wavelength of the measured magnetic field). In order to not disturb the spatial magnetic field distribution in the vicinity of the measurement object 11, the measurement unit 15 including the filter or amplifier 14 must be placed at a certain distance from the magnetic field sensor 12.

The magnetic field measurement system of the embodiment allows the magnetic field to be measured with the spatial resolution of the detection width L/2, using the loop antenna of detection width L. In addition, a user can determine the portion to be a magnetic field generating source within the measurement object through the display unit 17.

Figure 3:
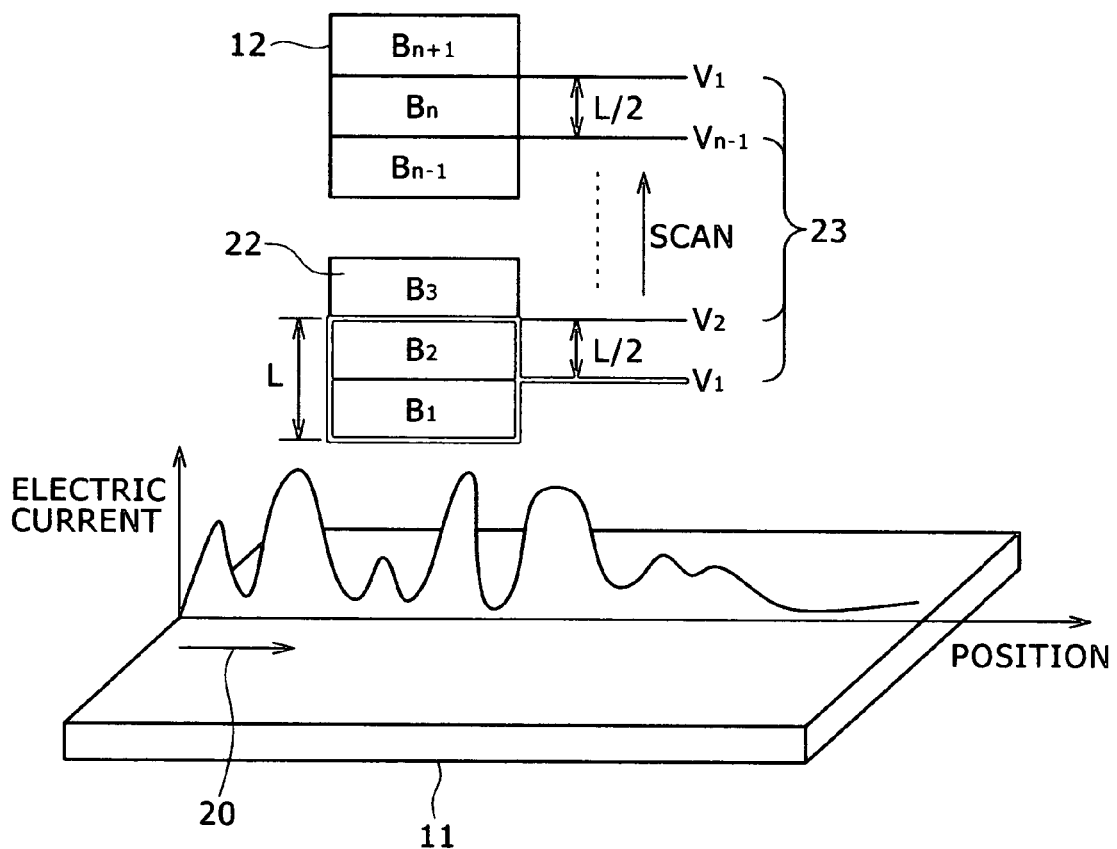
FIG. 3 is a schematic diagram showing a variant of the embodiment of FIG. 1.

Incidentally, in Embodiment 1, the description has been made in the case in which the magnetic field is measured along the surface of the measurement object 11 (namely, in the direction in which the current flows). FIG. 3 shows the case in which the magnetic field is measured along the vertical (height) direction to the surface of the measurement object 11. In this case, the magnetic field sensor 12 is scanned in the vertical direction at the spacing L/2, and induced voltages 23 at each position are calculated in the same way as the above described Equations (1) to (4), allowing the magnetic field to be measured in the height direction with the special resolution of the detection width L/2.

Embodiment 2

Next, as another embodiment of the present invention, the description will be made about the case in which the scan spacing is set to L/3 relative to the loop width L of the loop antenna. The measurement principle is common to Example 1, but the arithmetic equations are different. The magnetic field densities for each scan spacing L/3 are represented by B1, B2 and so on, respectively. With the loop area So, the displacement area for each scan spacing is defined by S=So/3. The induced voltages of the loop antenna at each measuring position, when represented by V1, V2 and so on, are expressed as V1=ωS(B1+B2+B3), V2=ωS(B2+B3+B4) and so on respectively, depending on the magnetic flux density B interlinked within the loop. Then, as shown in Equation (5), the processing of addition and subtraction is performed for the measured voltage values V1, V2 and so on, respectively.

First, the difference between the voltages V1 and V2 is calculated to leave the B1 component, while deleting the B2 and B3 components. At this time, the B4 component remains, but is deleted by adding V4. The further remaining B5 and B6 components are deleted by subtracting V5. Subsequently, this is repeated and finally the B1 component and the Bn+1 component remain. In this operation, of the measured induced voltages, the measured values V3, V6 and so on that are located at a multiple of 3 are not used.

$$V1 = (B1 + B2 + B3) \times \omega S \ -)$$
$$V2 = (B2 + B3 + B4) \times \omega S0 \ \times)$$
$$V3 = (B3 + B4 + B5) \times \omega S \ +)$$
$$V4 = (B4 + B5 + B6) \times \omega S \ -)$$
$$V5 = (B5 + B6 + B7) \times \omega S0 \ \times)$$
$$V6 = (B6 + B7 + B8) \times \omega S \ +)$$
$$...$$
$$Vn-2 = (Bn-2 + Bn-1 + Bn) \times \omega S \ -)$$
$$Vn-1 = (Bn-1 + Bn + Bn+1) \times \omega S$$
$$V1 - V2 + 0 \times V3 + V4 - V5 + 0 \times V6 ... + (Vn-2) - (Vn-1) =$$
$$(B1 - Bn+1) \times \omega S \quad (5)$$

Here, for the last component Bn+1, approximating the magnetic flux density within the loop as uniform (Bn≈Bn+1) and setting Bn+1=Vn/3ωS, it is:

$$V1-V2+V4-V5 ... +(Vn-2)-(Vn-1)=B1\omega S-(Vn-1)/3$$

Setting S=So/3, the magnetic flux density B1 at the measurement starting point can be determined by the following equation:

$$B1=(3/\omega So)\{V1-V2+V4-V5 ... +(Vn-2)-(2/3)(Vn-1)\} \quad (6)$$

Similarly, by displacing the operation starting positions as V2, V3, the magnetic field densities at the other positions can be determined as:

$$B2=(3/\omega So)\{V2-V3+V5-V6 \ . \ . \ . \ -(Vn-2)+(2/3)(Vn-1)\} \quad (7)$$

$$B3=(3/\omega So)\{V3-V4+V6-V7 \ . \ . \ . \ +(Vn-2)-(2/3)(Vn-1)\} \quad (8)$$

With such an arithmetic operation, by using the loop antenna of scan direction dimension (detection width) L and measuring at the scan spacing L/3, the measurement result with resolution equivalent to the loop antenna of the scan direction dimension L/3 can be obtained.

Embodiment 3

Figure 4:
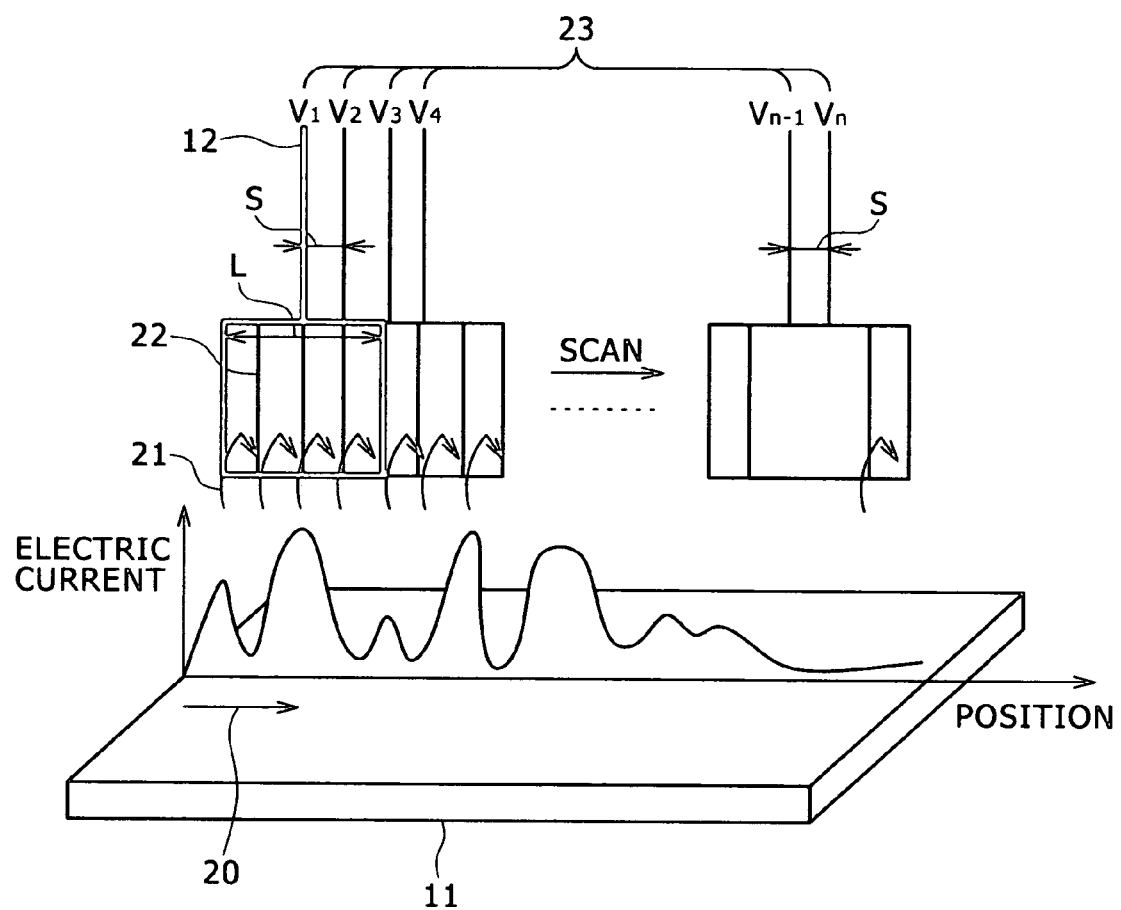
FIG. 4 is a schematic diagram showing another embodiment of the magnetic field measurement method according to the present invention.

Further, as another embodiment of the present invention shown in FIG. 4, the description will be made about the general case in which the scan spacing is set to s which is smaller than L (note that s=L/integer) relative to the loop width L of the loop antenna. The magnetic field densities for each scan spacing s are represented by B1, B2 and so on, respectively. With the loop area So, the area drawn at each scan spacing is defined as S=So(s/L). The induced voltages of the loop antenna at each measuring position, when represented by V1, V2 and so on, are expressed as V1=ωS(B1+

Figure 5:
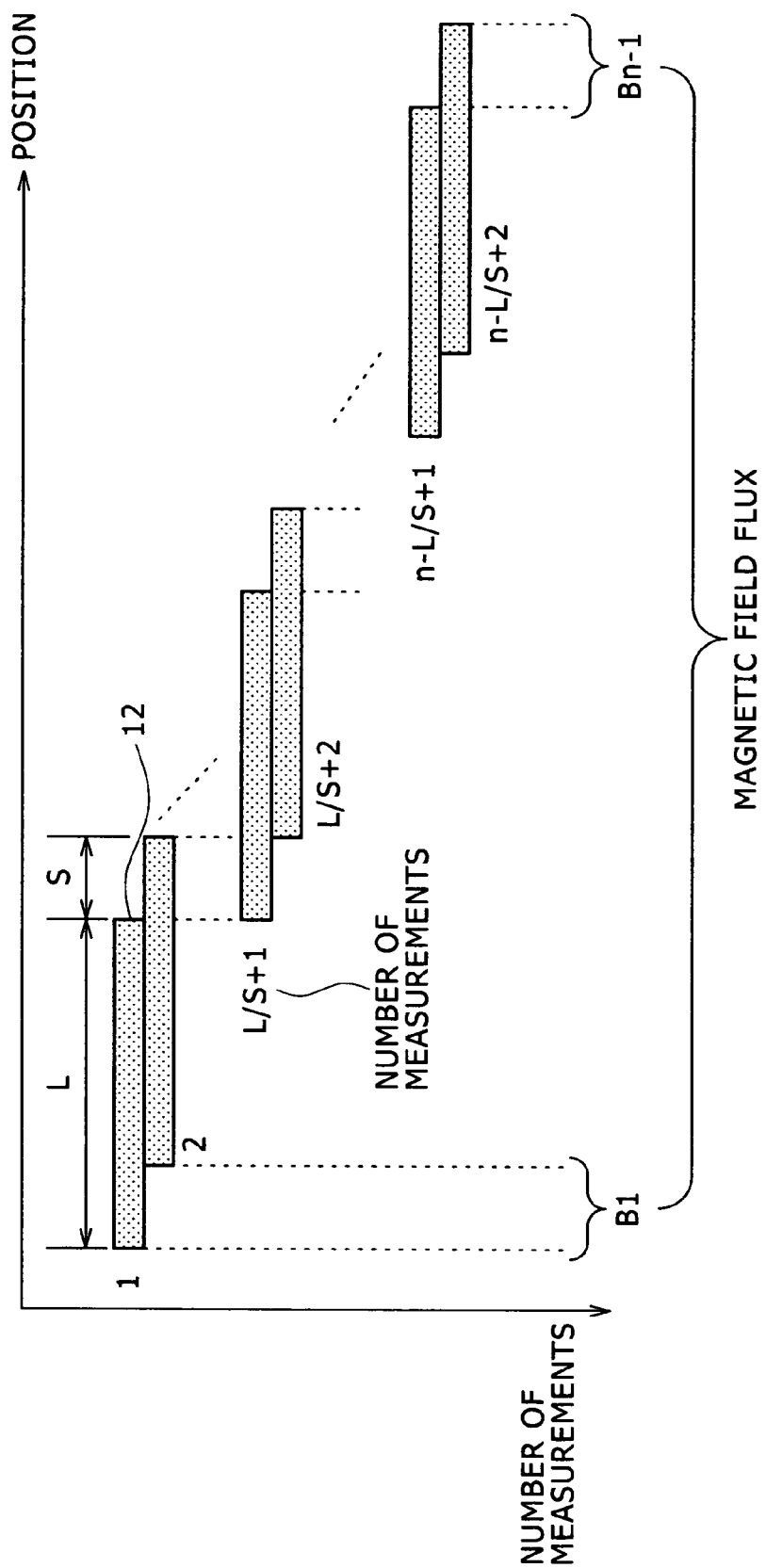
FIG. 5 is a schematic diagram illustrating an arithmetic operation method in FIG. 4.

B2+ ... +BL/s), V2=ωS(B2+B3+ ... +BL/s+1) and so on respectively, depending on the magnetic flux density B interlinked within the loop. Then, as shown in Equation (9), the processing of addition and subtraction is performed for the measured voltage values V1, V2 and so on, respectively. FIG. 5 schematically illustrates this operation.

First, the difference between the voltages V1 and V2 is calculated to leave the B1 component, while deleting the B2, B3 ..., BL/s components. At this time, the BL/s+1 component remains, but is deleted by adding VL/s+1. The further remaining BL/s+2, BL/s+3 ... components are deleted by subtracting VL/s+2. Subsequently, this is repeated and finally the B1 component and the Bn+1 component remain. In this operation, of the measured induced voltages, the measured values of V3 to VL/s and the repeating values thereof are not used. In other words, the operation is performed by determining the difference between the measured value at the first position and the measured value at the position adjacent to the first position at the spacing s, and the differences between the measured values at positions each away from the first position by a distance of integer multiple of the loop width L and the measured values at positions each adjacent to the former positions at the spacing s respectively, and then adding these differences.

$$V1 = (B1 + B2 + \ldots + BL/s) \times \omega S \, -)$$
$$V2 = (B2 + \ldots + BL/s + BL/s + 1) \times \omega S \, +)$$
$$\ldots$$
$$VL/s + 1 = (BL/s + 1 + \ldots + B2L/s) \times \omega S \, -)$$
$$VL/s + 2 = (BL/s + 2 + \ldots + B2L/s + B2L/s + 1) \times \omega s \, +)$$
$$\ldots$$
$$Vn - L/s + 1 = (Bn - L/s + 1 + \ldots + Bn) \times \omega S \, -)$$
$$Vn - L/s + 2 = (Bn - L/s + 2 + \ldots + Bn + Bn + 1) \times \omega S$$
$$V1 - V2 + \ldots + (VL/s + 1) - (VL/s + 2) + \ldots +$$
$$(Vn - L/s + 1) - (Vn - L/s + 2) = (B1 - Bn + 1) \times \omega S \quad (9)$$

Here, for the last component Bn+1, approximating the magnetic flux density within the loop as uniform (Bn≈Bn+1) and setting Bn+1=(Vn−L/s+2)(s/L)/ωS, it is:

$$V1 - V2 + \ldots + (VL/s + 1) - (VL/s + 2) + \ldots +$$
$$(Vn - L/s + 1) - (Vn - L/s + 2) = B1\omega S - (Vn - L/s + 2)(s/L)$$

Setting S=So(s/L), the magnetic flux density B1 at the measurement starting point can be determined by the following operation:

$$B1 = \left\{ \begin{array}{c} (L/s/(\omega So))\{V1 - V2 + \ldots + (VL/s + 1) - \\ (VL/s + 2) + \ldots + (Vn - L/s + 1) - (1 - s/L)(Vn - L/s + 2) \end{array} \right\} \quad (10)$$

Similarly, by displacing the operation starting positions as V2, V3, the magnetic field densities at the other positions can be determined as:

$$B2 = \{(L/s)/(\omega So)\}\{V2 - V3 + \ldots + (VL/s + 2) - (VL/s + 3) + \quad (11)$$
$$\ldots + (Vn - L/s + 1) - (1 - s/L)(Vn - L/s + 2)\}$$

-continued
$$B3 = \{(L/s)/(\omega So)\}\{V3 - V4 + \ldots + (VL/s + 3) - (VL/s + 4) + \quad (12)$$
$$\ldots + (Vn - L/s + 1) - (1 - s/L)(Vn - L/s + 2)\}$$

With such an arithmetic operation, by using the loop antenna of the scan direction dimension (detection width) L and measuring at the scan spacing s, the measurement result with resolution equivalent to the loop antenna of the scan direction dimension s can be obtained. In other words, the resolution is independent on the dimension L of the loop antenna.

Further, in the embodiment, the spacing s is made variable to allow the spacing to be selected depending on the measurement object accordingly. At this time, the resolution in the measurement is improved by reducing s, while the operation output (difference V1−V2) must be substantially turned down. Thus, the measurement spacing s may be set in consideration of the balance between the two sides according to the purpose of the measurement. At this time, the measurement spacing s can be arbitrary set in the controller 13. It is also allowable that the data is acquired (almost sequentially) at a measurement spacing smaller than s, and then the data to be used for the operation is sampled at the spacing s.

Then, the magnetic field strength data directly measured by the magnetic field sensor, and the magnetic field strength distribution determined by sampling the magnetic field strength data at several values of the spacing s and performing the arithmetic processing, are stored in a memory of the computer 16. Among these, the user can select the magnetic field strength distribution subjected to the arithmetic processing with the desired resolution, and can have the selected distribution displayed in the display unit 17.

Embodiment 4

Next, the description will be made about the result of which the advantage according to the measurement method of the present invention is specifically verified by the numerical analysis.

Figure 6:
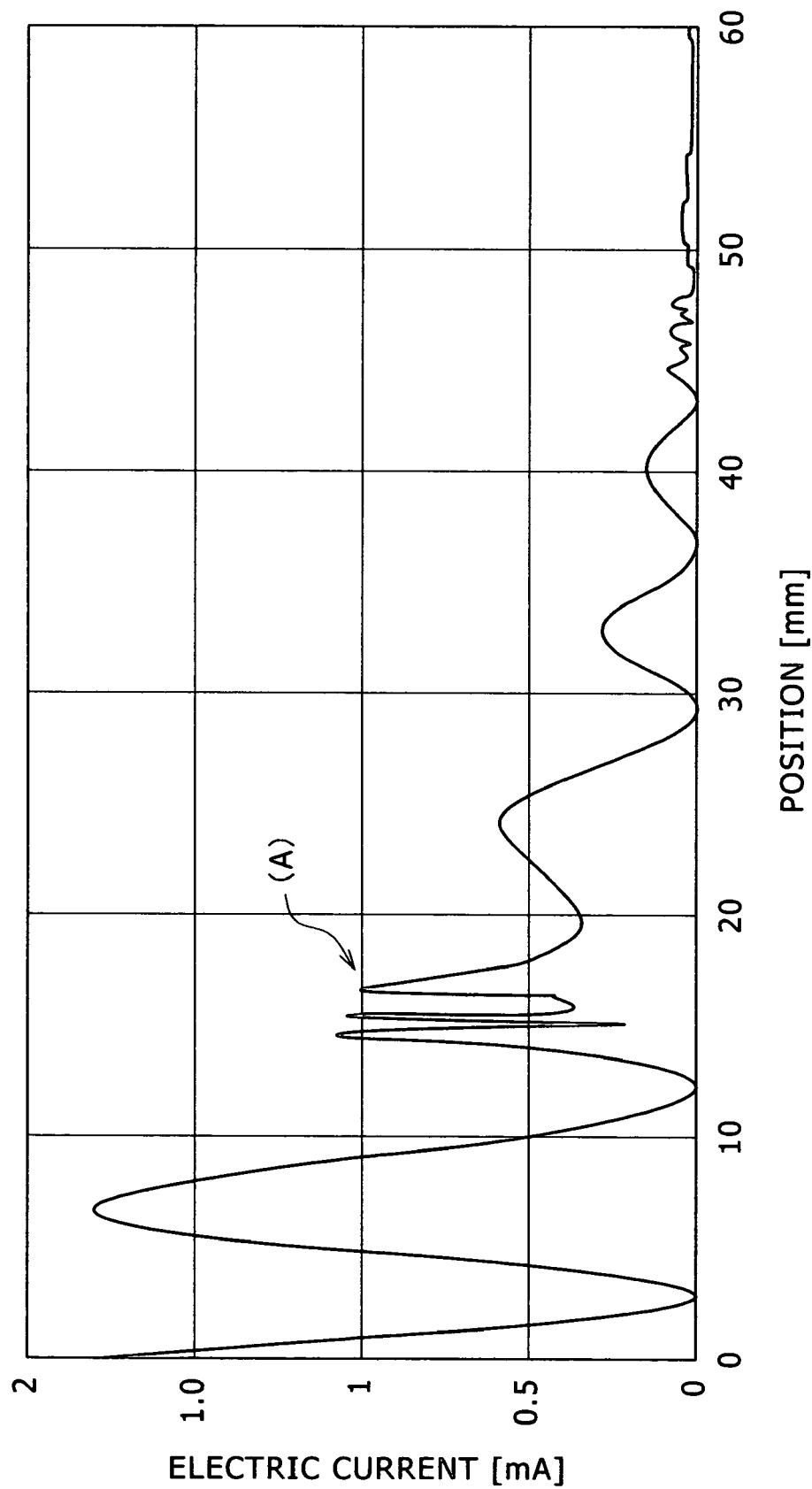
FIG. 6 is a view showing the electric current distribution set for the operation verification of the present invention.
Figure 7:
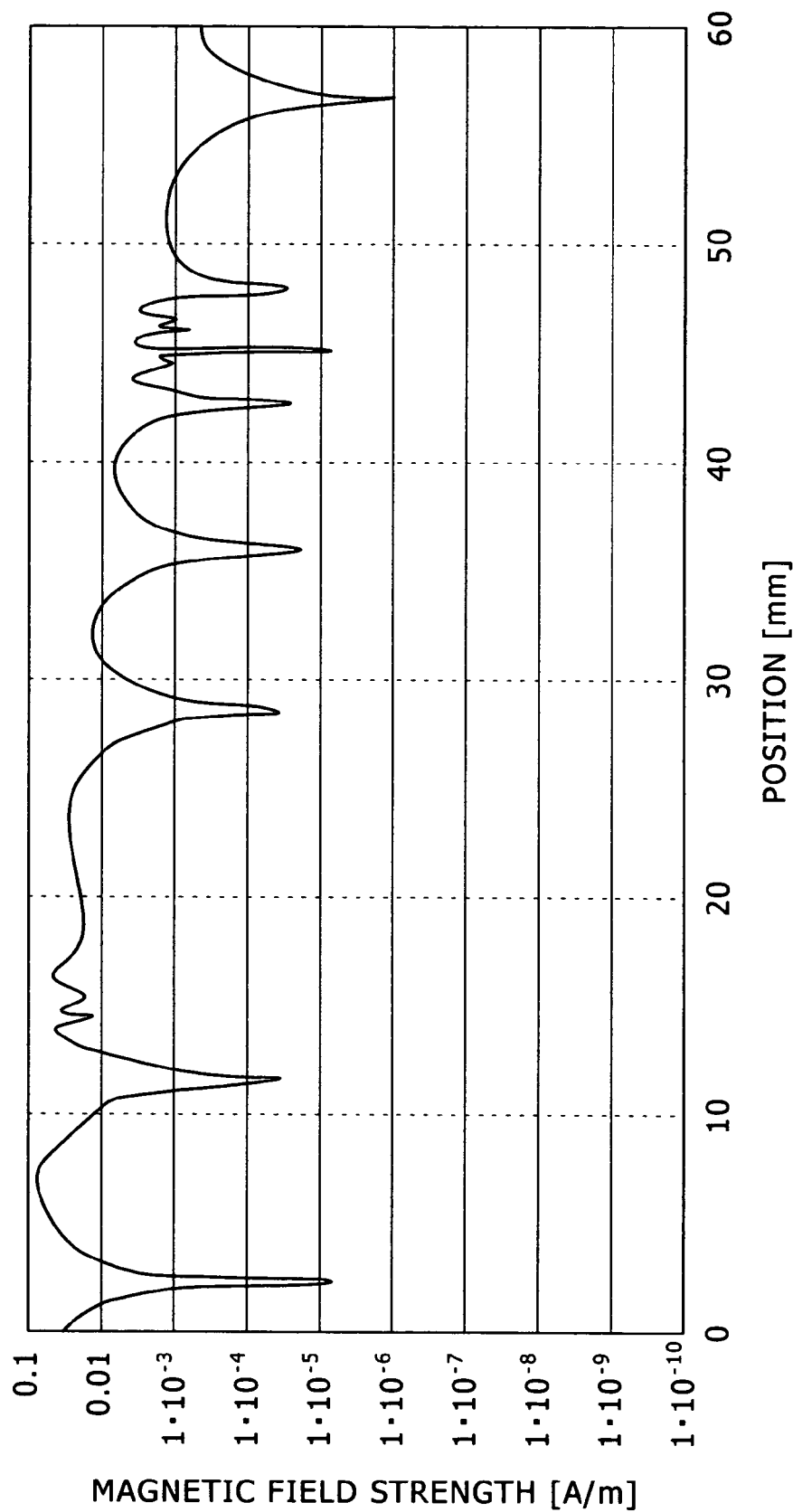
FIG. 7 is a view showing the magnetic field distribution generated from the electric current distribution of FIG. 6.

FIG. 6 shows the electric current distribution set as the measurement object. The measurement range is set to 0 to 60 mm, in which the current value is varied at a cycle of about 1 mm in the densest part (A). The current frequency is set to 10 GHz. FIG. 7 shows the calculation result of the magnetic field strength distribution that the electric current given in FIG. 6 is generated at a distance of 5 mm from the surface.

Figure 8:
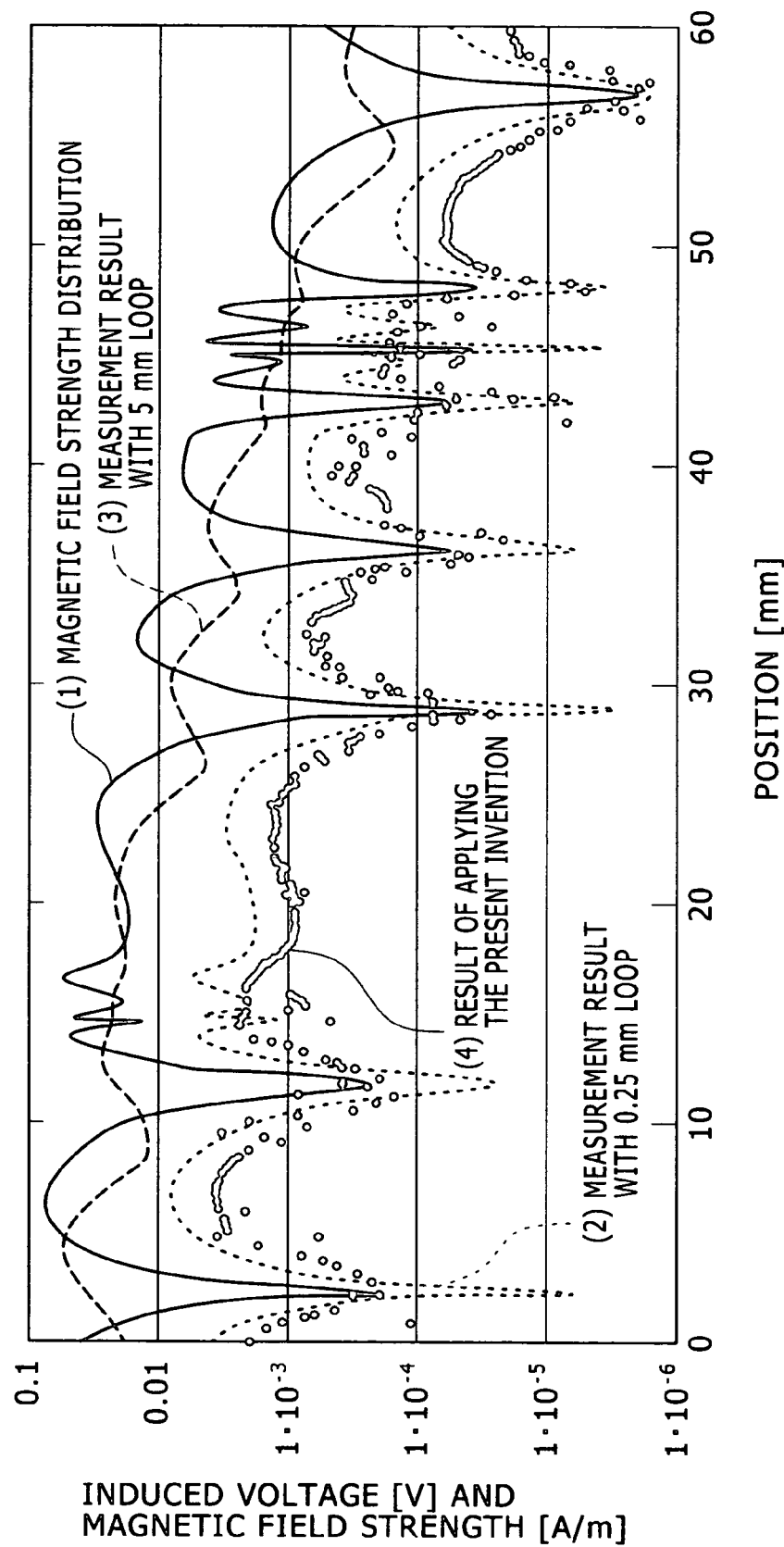
FIG. 8 is a view showing an example of the magnetic field distribution measured according to the present invention.

FIG. 8 shows the magnetic field strength (or induced voltage) measured by the magnetic field sensor. The vertical axis is indicated by the logarithmic scale in order to eliminate the difference in the sensitivities of the magnetic field sensors and to relatively compare the strength distributions.

Curve (1) represents a given magnetic field strength distribution, showing the distribution of FIG. 7 as it is.

Curve (2) represents the result of which the induced voltages, which are obtained when using a loop antenna of a loop size of 0.25 mm and scanning it in parallel to the current direction at a distance of 5 mm from the current position, are determined by calculation. From the result, it can be seen when using the loop antenna of 0.25 mm size that the induced voltages well following the magnetic field strength distribution of (1) can be obtained and the magnetic field strength can be measured with sufficient resolution relative to the distribution to the extent of (1).

Curve (3) represents the result of which the induced voltages, which are obtained when using a loop antenna of a loop size of 5 mm and scanning it in parallel to the current direction at a distance of 5 mm from the current position, are determined by calculation. At this time, although the magnetic field strength within the loop is reduced as away from the electric current, the calculation is made assuming that the magnetic field strength within the loop is uniform, not depending on the distance from the electric current. From the result, it can be seen that with the loop antenna of 5 mm size, the induced voltages cannot follow the magnetic field strength distribution of (1) and the resolution is insufficient.

Curve (4) represents the example of realizing high resolution at a detection width s=0.25 mm by applying the arithmetic processing (Embodiment 3) of the present invention, using the above data of (3) (loop size L=5 mm). It plots the calculation results for each scan spacing 0.25 mm. As a result, the distribution with substantially the same tendency as in the case of using the loop antenna of 0.25 mm size shown in (2) can be obtained. This allows to verify that the resolution of the magnetic field measurement can be improved by the measurement method of the present invention.

More specifically, compared to the distribution (2), the result of (4) in which the present invention was employed includes an error. Because the approximation that the magnetic field strength distribution at the measurement end position in the range of 55 to 60 mm is uniform is used. Thereby, when the scan range is extended and the magnetic field strength at the end position thereof is sufficiently reduced to the ignorable level, the accuracy can be further improved.

Embodiment 5

Figure 9:
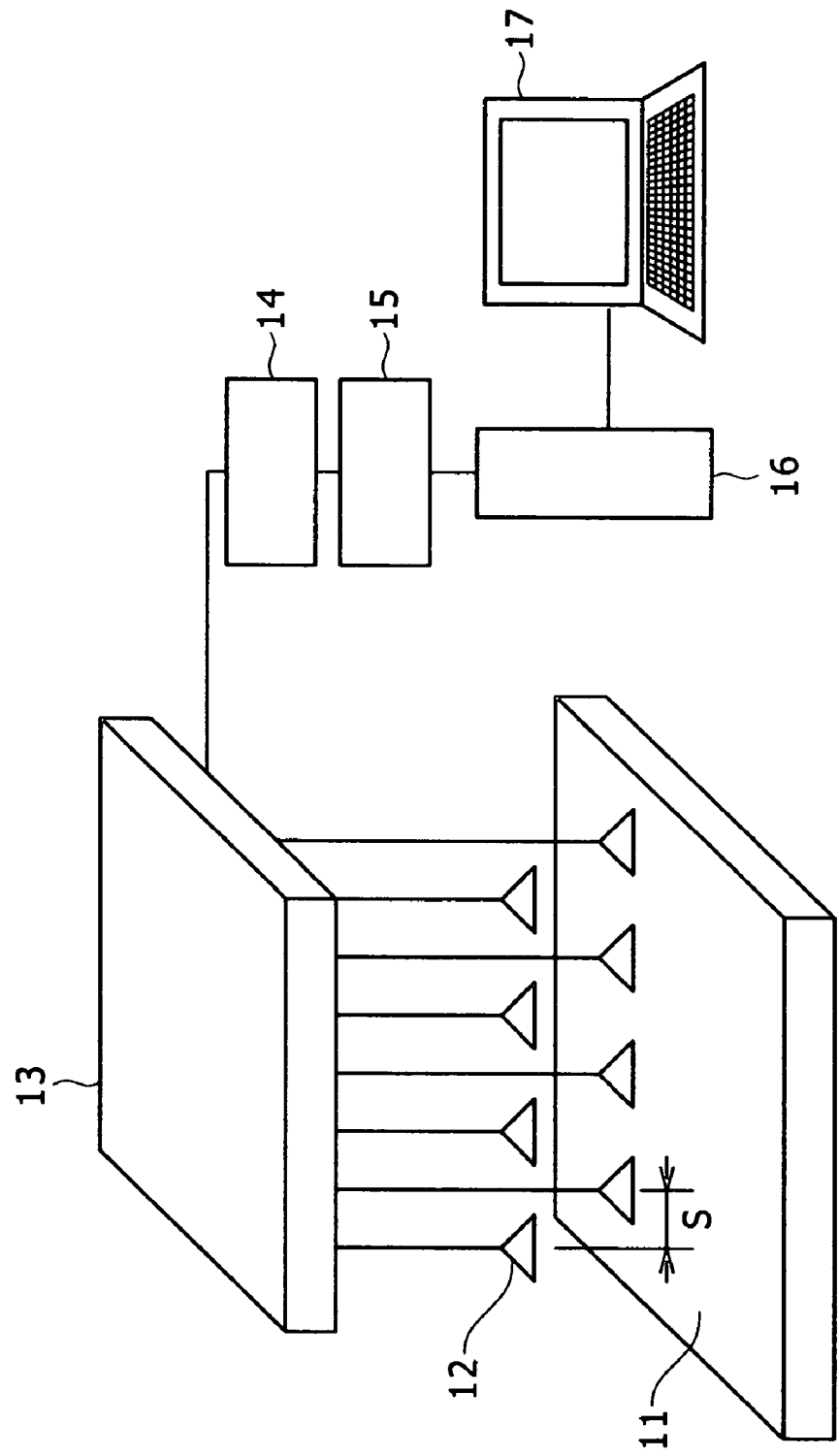
FIG. 9 is a block diagram showing another embodiment of the magnetic field measurement system according to the present invention.

FIG. 9 is a block diagram showing another embodiment of the magnetic field measurement system according to the present invention. In the above described embodiment of FIG. 2, it is illustrated that the magnetic field is measured by scanning one magnetic field sensor (loop antenna) in the vicinity of the measurement object 11. On the contrary, in this embodiment, plural magnetic field sensors 12 are placed along the measurement object 11 in an array form to serve as a magnetic field sensor array. The magnetic field sensors are each placed at a spacing s (L/integer) which is smaller than its loop width L. The measurement unit 15 measurers the induced voltages (magnetic field strengths) at each position from the signals detected in parallel by the magnetic field sensors. The computer 16 determines the magnetic field strength at each position according to the above described Equations (9) to (12) at the spacing s, based on the measurement data from the measurement unit 15.

The magnetic field measurement system of the embodiment allows the magnetic field to be measured with the spatial resolution of detection width s, using the loop antenna of detection width L. In the embodiment, the outputs of the magnetic field sensors are processed in parallel, which is effective to the unsteady state measurement such that the magnetic field strength of the measurement object 11 temporally varies.

Embodiment 6

Figure 10:
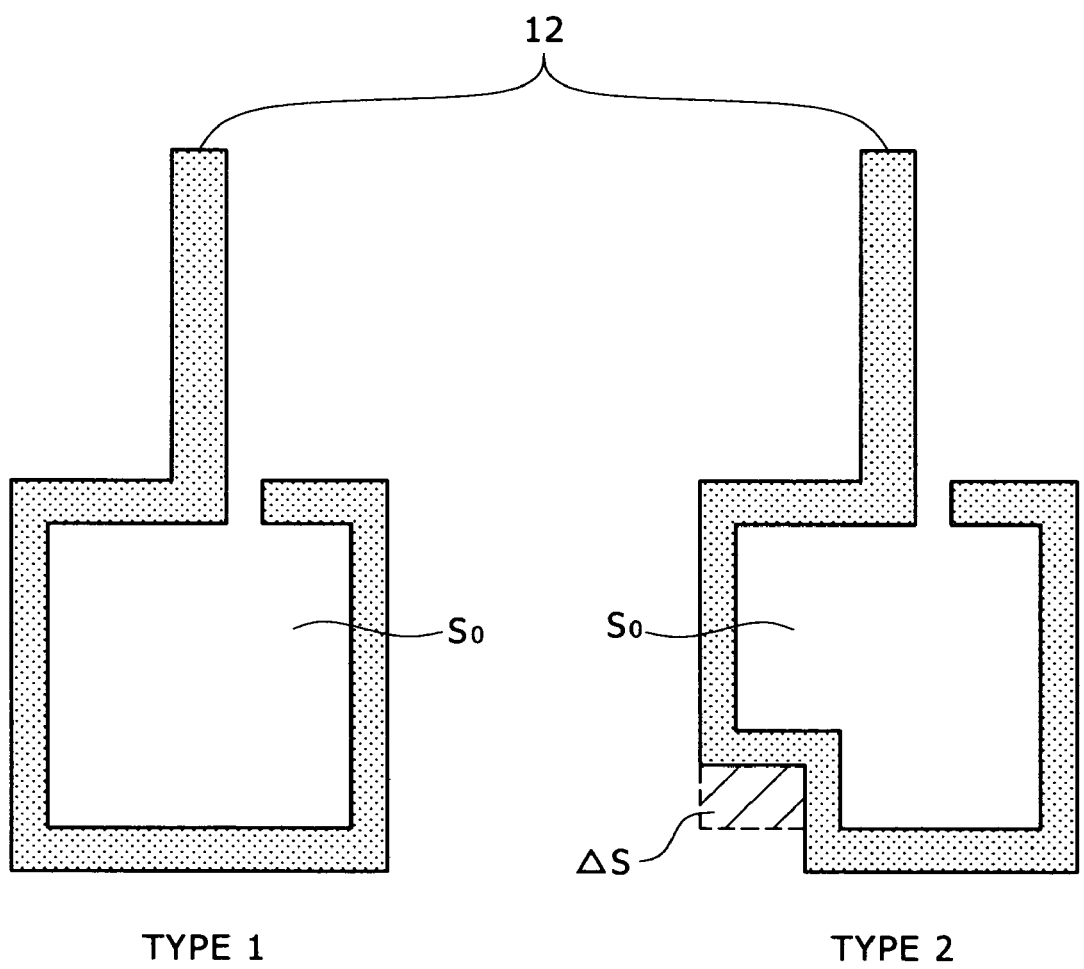
FIG. 10 is a view showing still another embodiment of the magnetic field sensors according to the present invention.

FIGS. 10 and 11 are views showing still another embodiment of the magnetic field measurement method according to the present invention. In the embodiment, two types of the magnetic field sensors 12 (type 1 and type 2) are used, wherein a portion of the loop shape is different between the two loop antennas. In the figure, it differs by area $\Delta S$ within the loop. The induced voltages V1 and V2 of each of the magnetic field sensors at the same position relative to the measurement object are measured, and the difference (V1−V2=$\omega\Delta S$B) is calculated to determine the magnetic field strength in the area $\Delta S$. This enables the measurement with the area $\Delta S$ which is far smaller than the entire loop size So as the detection area, thereby allowing the spatial resolution to be improved. This method makes it easy to ensure the dimension accuracy in the manufacturing of the magnetic field sensor compared to the conventional method of raising the resolution by making a single magnetic field sensor substantially compact.

Further, it is also allowable to use a common magnetic field sensor to reversibly deform a portion of its loop, instead of preparing the two types of magnetic field sensors 12 (type 1 and type 2) separately. For example, it is possible to slightly deform the loop by $\Delta S$ with an electric actuator. Because of this feature, the work for adjusting the positions of the two types of the magnetic field sensors in the measurement is no longer required, so that the error due to position adjustment accuracy will not occur.

Further, as shown in FIG. 11, it is possible to measure the magnetic field strengths B1, B2 and so on at each position with the resolution $\Delta S$ by scanning the two types of the magnetic field sensors 12. At this time, when the scan spacing (measurement spacing) is set to smaller than the above area $\Delta S$, the spatial resolution can be further improved depending on the scan spacing, based on the measurement principle of Embodiments 1 to 3 described above.

Further, it is possible to calculate the spatial distribution of pointing vector <P> indicating the electromagnetic wave energy, by measuring a magnetic field strength distribution <E> that the measurement object 11 generates, together with a magnetic field strength distribution <H> measured in the above embodiments, and by calculating the cross product equation (13). This result can also be displayed in the display unit 17. Thereby, evaluation can be made on the electromagnetic wave radiation of electronic equipment and other devices.

$$<P>=<E>\times<H> \quad (13)$$

Having illustrated the case of using a rectangular loop antenna as the magnetic field sensor 12 in the above embodiments, it is to be understood that the present invention is not limited to these embodiments. Any other loop antenna is applicable thereto, for example, such as a circular loop antenna. In the case of using the circular loop antenna, it is possible to measure with the resolution equivalent to that of the rectangular loop, as long as the magnetic field strengths are uniform within the range of the spacing s in the loop scanning.

Further, sensors other than the loop antenna may also be used as the magnetic field sensor. The present invention is applicable to any sensor as long as such a sensor can detect the magnetic field strength and flux quantum generated in a certain area (dimension) in space. For example, a hall element and a magnetic resistance (MR) element are effective. These elements are of the type responsive to magnetic field (or magnetic flux), allowing the measurement of the direct current component (including the discrimination of the magnetic field direction) and the low-frequency component, which is impossible with the loop antenna, so that the measurement object range will be extended.

The present invention allows the magnetic field to be measured with the special resolution smaller than the magnetic field sensor size, without making the size of the magnetic field sensor substantially compact.

What is claimed is:

1. A magnetic filed measurement method using a magnetic field sensor of a detection width L, the method comprising the steps of:
    scanning the magnetic field sensor in a direction of the detection width;
    measuring a magnetic field strength at each spacing s which is smaller than the detection width L;
    performing arithmetic processing including addition and subtraction in relation to the magnetic field strength values measured at the each spacing s; and
    determining the magnetic field strength at the detection width of the spacing s along a scanning direction,
    wherein the arithmetic processing:
        determines a difference between the magnetic field strength value measured at a desired position and the magnetic field strength value at an adjacent position separated from the desired position by the spacing s,
        determines the differences between the magnetic field strength values at a plurality of third positions separated from the desired position by an integer multiple of the detection width L and the magnetic field strength values at a plurality of fourth positions corresponding to the plurality of third positions with each fourth position being separated from a respective third position by the spacing s, and
        adds these differences to determine the magnetic field strength at the desired position.

2. The magnetic field measurement method according to claim 1, wherein the arithmetic processing is performed assuming that the magnetic field strength within the detection width L is uniform at an end position in an operation range.

3. The magnetic field measuring method according to claim 1, comprising the step of making the measurement spacing s according to the magnetic field sensor variable to set the spacing s depending on desired resolution.

4. The magnetic field measurement method according to claim 1, comprising use of a loop antenna as the magnetic field sensor.

5. The magnetic field measurement method according to claim 4, wherein the loop antenna has a rectangular shape.

6. A magnetic field measurement system comprising:
    a magnetic field sensor of a detection width L for detecting the magnetic field;
    a control section for scanning the magnetic field sensor at spacing s which is smaller than the detection width L in a direction of the detection width;
    a measurement section for measuring a magnetic field strength at the each spacing s from a detection signal of the magnetic field sensor; and
    an arithmetic operation section for performing arithmetic processing including addition and subtraction in relation to the magnetic field strength values measured by the measurement section at the each spacing s, to determine the magnetic field strength at the detection width of the spacing s along a scanning direction,
    wherein the arithmetic operation section:
        determines a difference between the magnetic field strength value measured at a desired position and the magnetic field strength value measured at an adjacent position separated from the desired position by the spacing s,
        determines differences between the magnetic field strength values at a plurality of third positions separated from the desired position by an integer multiple of the detection width L and the magnetic field strength values at a plurality of fourth positions corresponding to the plurality of third positions with each fourth position being separated from a respective third position by the spacing s, and
        adds these differences to determine the magnetic field strength at the desired position.

7. The magnetic field measurement system according to claim 6, comprising use of a loop antenna as the magnetic field sensor.

8. The magnetic field measurement system according to claim 7, wherein the loop antenna has a rectangular shape.

9. The magnetic field measurement system according to claim 6, wherein the control section sets the scan spacing s of the magnetic field sensor depending on desired resolution.

10. The magnetic field measurement system according to claim 6, wherein the measurement section is provided with a filter for extracting a magnetic field strength of a desired frequency component from a detection signal of the magnetic field sensor.

11. The magnetic field measurement system according to claim 6, comprising a display section for displaying a magnetic field strength at each position determined by the arithmetic operation section.

* * * * *